United States Patent [19]
Obata et al.

[11] Patent Number: 5,681,500
[45] Date of Patent: Oct. 28, 1997

[54] MAGNETIC OXIDE HAVING A LARGE MAGNETORESISTANCE EFFECT AT ROOM TEMPERATURE

[75] Inventors: Takeshi Obata; Hisanao Tsuge; Nobuaki Shohata, all of Tokyo, Japan

[73] Assignee: NEC Corporation, Tokyo, Japan

[21] Appl. No.: 670,615

[22] Filed: Jun. 26, 1996

[30] Foreign Application Priority Data

Jun. 26, 1995 [JP] Japan .................................. 7-159544

[51] Int. Cl.$^6$ .............. G01R 33/06; G11B 5/39; H01F 10/18
[52] U.S. Cl. .................... 252/62.51 R; 423/593
[58] Field of Search ............... 252/62.51 R; 423/593

[56] References Cited

U.S. PATENT DOCUMENTS

5,549,977  8/1996  Jin et al. .................. 252/62.51 R

*Primary Examiner*—Melissa Bonner
*Attorney, Agent, or Firm*—Young & Thompson

[57] ABSTRACT

A magnetic oxide represented by $A_{1-x}A'_xMn_{1-y}M_yO_z$, where: A is at least one element selected from the group consisting of lanthanoid, Y and Bi; A' is at least one element selected from the group consisting of alkaline earth metals and Pb; M is at least one element selected from the group consisting of Ni and Cu; $0<x$, $y \leq 0.5$; and $2.5 \leq z \leq 3.5$.

8 Claims, 5 Drawing Sheets

MAGNETIC OXIDE HAVING A LARGE MAGNETORESISTANCE EFFECT AT ROOM TEMPERATURE

BACKGROUND OF THE INVENTION

The present invention relates to a magnetic oxide having a large magnetoresistance effect at room temperature and a magnetic detector or sensor utilizing the same.

One of various magnetic oxides which has higher sensitivity than permalloy was reported and is disclosed in IEEE Transaction on Magnetics, Vol. Mag.-18, No. 2 (1982) pp. 707–708. Another magnetic oxide which has higher sensitivity than permalloy was reported and is disclosed in Physical Review B, Vol. 43, No. 1 (1991) pp. 1297–1300. Still another magnetic oxide which has higher sensitivity than permalloy was reported and is disclosed in Applied Physics Letters Vol. 63, No. 14 (1993) pp. 1990–1992. Yet another magnetic oxide which has higher sensitivity than pennalloy was reported and is disclosed in Applied Physics Letters Vol. 64, No. 22 (1994) pp. 3045–3047. Further another magnetic oxide which has higher sensitivity than permalloy was reported and is disclosed in the Japanese laid-open patent application No. 6-237022.

The conventional magnetic oxides show large magnetoresistance but have the following disadvantages. The large magnetoresistance may be obtained at a temperature much lower than room temperature. The conventional magnetic oxides have a large saturation magnetic field. It is difficult to repair spin disorder of electrons in the magnetic oxide by application of a weak magnetic field. A transition temperature from ferromagnetism into paramagnetism is much lower than room temperature, for which reason it is difficult to obtain a large variation of magnetoresistance thereof to room temperature.

In the above circumstances, it had been required to develop a quite novel magnetic oxide showing a large variation in magnetoresistance by a small variation of a weak magnetic field to improve a sensitivity of the magnetic oxide as a magnetic sensor or detector.

SUMMARY OF THE INVENTION

Accordingly, it is an object of the present invention to provide a magnetic oxide showing a large magnetoresistive effect at room temperature.

It is a further object of the present invention to provide a magnetic oxide showing a large variation in magnetoresistance at room temperature.

It is furthermore a object of the present invention to provide a magnetic oxide have a small saturation magnetic field.

It is moreover a object of the present invention to provide a magnetic oxide showing a large magnetoresistive effect at room temperature and which allows repair of spin disorder of electrons in the magnetic oxide by application of a weak magnetic field to obtain a small saturation magnetic field.

It is still a further object of the present invention to provide a magnetic oxide showing a large magnetoresistive effect at room temperature and which has a transition temperature from ferromagnetism to paramagnetism, wherein the transition temperature is near room temperature so as to obtain a large variation of magnetoresistance thereof to room temperature.

It is yet a further object of the present invention to provide a highly sensitive magnetic detector utilizing a magnetic oxide showing a large magnetoresistive effect at room temperature.

It is still another object of the present invention to provide a highly sensitive magnetic detector utilizing a magnetic oxide showing a large variation in magnetoresistance at room temperature.

It is another object of the present invention to provide a highly sensitive magnetic detector utilizing a magnetic oxide have a small saturation magnetic field.

It is still another object of the present invention to provide a highly sensitive magnetic detector utilizing a magnetic oxide showing a large magnetoresistive effect at room temperature and allowing a repair of spin disorder of electrons in the magnetic oxide by application of a weak magnetic field to obtain a small saturation magnetic field.

It is yet still another object of the present invention to provide a highly sensitive magnetic detector utilizing a magnetic oxide showing a large magnetoresistive effect at room temperature and having a transition temperature from ferromagnetism to paramagnetism, wherein the transition temperature is near room temperature so as to obtain a large variation of magnetoresistance thereof to room temperature.

The above and other objects, features and advantages of the present invention will be apparent from the following descriptions.

The present invention provides a magnetic oxide represented by $A_{1-x}A'_xMn_{1-y}M_yO_z$, where: A is at least one element selected from the group consisting of lanthanoid, Y and Bi; A' is at least one element selected from the group consisting of alkaline earth metals and Pb; M is at least one element selected from the group consisting of Ni and Cu; $0<x$, $y\leq 0.5$; and $2.5\leq z\leq 3.5$.

The above magnetic oxide shows a large magnetoresistive effect at room temperature and a large variation in magnetoresistance at room temperature. The above magnetic oxide has an atomic structure allowing a repair of spin disorder of electrons in the magnetic oxide by application of a weak magnetic field to obtain a small saturation magnetic field. The above magnetic oxide also has a transition temperature from ferromagnetism into paramagnetism, wherein the transition temperature is near room temperature so as to obtain a large variation of magnetoresistance thereof to room temperature.

The present invention also provides a magnetic oxide represented by $(A'_{1-x}A_x)_{n+1}(Mn_{1-y}M_y)_nO_z$, where: A is at least one element selected from the group consisting of lanthanoid, Y and Bi; A' is at least one element selected from the group consisting of alkaline earth metals and Pb; M is at least one element selected from the group consisting of Ni and Cu; $0<x$, $y\leq 0.5$; and $3n\leq z\leq 3n+2$, $n=1, 2, 3$.

The above magnetic oxide shows a large magnetoresistive effect at room temperature and a large variation in magnetoresistance at room temperature. The above magnetic oxide has an atomic structure allowing a repair of spin disorder of electrons in the magnetic oxide by application of a weak magnetic field to obtain a small saturation magnetic field. The above magnetic oxide also has a transition temperature from ferromagnetism into paramagnetism, wherein the transition temperature is near room temperature so as to obtain a large variation of magnetoresistance thereof to room temperature.

The present invention also provides a magnetic oxide represented by $(BiO)_2[(A_{1-x}A'_x)_n(Mn_{1-y}M_y)_{n+1}O_z]$, where: A is at least one element selected from the group consisting of lanthanoid, Y and Bi; A' is at least one element selected from the group consisting of alkaline earth metals and Pb; M is at least one element selected from the group consisting of Ta, Nb, Ti and Zr; $0\leq x\leq 0.5$; $0\leq y<1$; and $2n+2\leq z\leq 3n+4$, $n=2, 3, 4, 5$.

The above magnetic oxide shows a large magnetoresistive effect at room temperature and a large variation in magnetoresistance at room temperature. The above magnetic oxide has an atomic structure allowing a repair of spin disorder of electrons in the magnetic oxide by application of a weak magnetic field to obtain a small saturation magnetic field. The above magnetic oxide also has a transition temperature from ferromagnetism into paramagnetism, wherein the transition temperature is near room temperature so as to obtain a large variation of magnetoresistance thereof to room temperature.

The present invention also provides a magnetic oxide represented by $(Bi_{1-x}B_xO)_2[A_{n+1}(Mn_{1-y}M_y)_nO_z]$, where: A is at least one element selected from the group consisting of lanthanoid; B is at least one element selected from the group consisting of Pb and Tl; M is at least one element selected from the group consisting of Ni and Cu; $0.5 \leq x \leq 1$; $0 \leq y \leq 0.5$; and $2n+2 \leq z \leq 3n+2$, n=1, 2, 3, 4.

The above magnetic oxide shows a large magnetoresistive effect at room temperature and a large variation in magnetoresistance at room temperature. The above magnetic oxide has an atomic structure allowing a repair of spin disorder of electrons in the magnetic oxide by application of a weak magnetic field to obtain a small saturation magnetic field. The above magnetic oxide also has a transition temperature from ferromagnetism into paramagnetism, wherein the transition temperature is near room temperature so as to obtain a large variation of magnetoresistance thereof to room temperature.

The present invention also provides a highly sensitive magnetic detector comprising a magnetic oxide represented by $(Bi_{1-x}B_xO)_2[A_{n+1}(Mn_{1-y}M_y)_nO_z]$, where: A is at least one element selected from the group consisting of lanthanoid; B is at least one element selected from the group consisting of Pb and Tl; M is at least one element selected from the group consisting of Ni and Cu; $0.5 \leq x \leq 1$; $0 \leq y \leq 0.5$; and $2n+2 \leq z \leq 3n+2$, n=1, 2, 3, 4; and a pair of electrodes provided on said magnetic oxide and being separated from each other via said magnetic oxide.

The above highly sensitive magnetic detector utilizing the magnetic oxide shows a large magnetoresistive effect at room temperature and a large variation in magnetoresistance at room temperature. The above highly sensitive magnetic detector utilizing the magnetic oxide has an atomic structure allowing a repair of spin disorder of electrons in the magnetic oxide by application of a weak magnetic field to obtain a small saturation magnetic field. The above highly sensitive magnetic detector utilizing the magnetic oxide also has a transition temperature from ferromagnetism into paramagnetism, wherein the transition temperature is near room temperature so as to obtain a large variation of magnetoresistance thereof to room temperature.

The present invention also provides a highly sensitive magnetic detector comprising a magnetic oxide represented by $(A'_{1-x}A_x)_{n+1}(Mn_{1-y}M_y)_nO_z$, where: A is at least one element selected from the group consisting of lanthanoid, Y and Bi; A' is at least one element selected from the group consisting of alkaline earth metals and Pb; M is at least one element selected from the group consisting of Ni and Cu; $0<x$, $y \leq 0.5$; and $3n \leq z \leq 3n+2$, n=1, 2, 3; and a pair of electrodes provided on said magnetic oxide and being separated from each other via said magnetic oxide.

The above highly sensitive magnetic detector utilizing the magnetic oxide shows a large magnetoresistive effect at room temperature and a large variation in magnetoresistance at room temperature. The above highly sensitive magnetic detector utilizing the magnetic oxide has an atomic structure allowing a repair of spin disorder of electrons in the magnetic oxide by application of a weak magnetic field to obtain a small saturation magnetic field. The above highly sensitive magnetic detector utilizing the magnetic oxide also has a transition temperature from ferromagnetism into paramagnetism, wherein the transition temperature is near room temperature so as to obtain a large variation of magnetoresistance thereof to room temperature.

The present invention also provides a highly sensitive magnetic detector comprising a magnetic oxide represented by $(BiO)_2[(A_{1-x}A'_x)_n(Mn_{1-y}M_y)_{n+1}O_z]$, where: A is at least one element selected from the group consisting of lanthanoid, Y and Bi; A' is at least one element selected from the group consisting of alkaline earth metals and Pb; M is at least one element selected from the group consisting of Ta, Nb, Ti and Zr; $0 \leq x \leq 0.5$; $0 \leq y < 1$; and $2n+2 \leq z \leq 3n+4$, n=2, 3, 4, 5; and a pair of electrodes provided on said magnetic oxide and being separated from each other via said magnetic oxide.

The above highly sensitive magnetic detector utilizing the magnetic oxide shows a large magnetoresistive effect at room temperature and a large variation in magnetoresistance at room temperature. The above highly sensitive magnetic detector utilizing the magnetic oxide has an atomic structure allowing a repair of spin disorder of electrons in the magnetic oxide by application of a weak magnetic field to obtain a small saturation magnetic field. The above highly sensitive magnetic detector utilizing the magnetic oxide also has a transition temperature from ferromagnetism into paramagnetism, wherein the transition temperature is near room temperature so as to obtain a large variation of magnetoresistance thereof to room temperature.

The present invention also provides a highly sensitive magnetic detector comprising a magnetic oxide represented by $(Bi_{1-x}B_xO)_2[A_{n+1}(Mn_{1-y}M_y)_nO_z]$, where: A is at least one element selected from the group consisting of lanthanoid; B is at least one element selected from the group consisting of Pb and Tl; M is at least one element selected from the group consisting of Ni and Cu; $0.5 \leq x \leq 1$; $0 \leq y \leq 0.5$; and $2n+2 \leq z \leq 3n+2$, n=1, 2, 3, 4; and a pair of electrodes provided on said magnetic oxide and being separated from each other via said magnetic oxide.

The above highly sensitive magnetic detector utilizing the magnetic oxide shows a large magnetoresistive effect at room temperature and a large variation in magnetoresistance at room temperature. The above highly sensitive magnetic detector utilizing the magnetic oxide has an atomic structure allowing a repair of spin disorder of electrons in the magnetic oxide by application of a weak magnetic field to obtain a small saturation magnetic field. The above highly sensitive magnetic detector utilizing the magnetic oxide also has a transition temperature from ferromagnetism into paramagnetism, wherein the transition temperature is near room temperature so as to obtain a large variation of magnetoresistance thereof to room temperature.

BRIEF DESCRIPTIONS OF THE DRAWINGS

Preferred embodiments of the present invention will be described in detail with reference to the accompanying drawings.

DISCLOSURE OF THE INVENTION

The present invention provides a first magnetic oxide represented by $A_{1-x}A'_xMn_{1-y}M_yO_z$, where: A is at least one element selected from the group consisting of lanthanoid, Y and Bi; A' is at least one element selected from the group consisting of alkaline earth metals and Pb; M is at least one element selected from the group consisting of Ni and Cu; $0<x$, $y \leq 0.5$; and $2.5 \leq z \leq 3.5$.

The above magnetic oxide shows a large magnetoresistive effect at room temperature and a large variation in magnetoresistance at room temperature. The above magnetic oxide has an atomic structure allowing a repair of spin disorder of electrons in the magnetic oxide by application of a weak magnetic field to obtain a small saturation magnetic field.

The above magnetic oxide also has a transition temperature from ferromagnetism into paramagnetism, wherein the transition temperature is near room temperature so as to obtain a large variation of magnetoresistance thereof to room temperature.

Figure 1A:
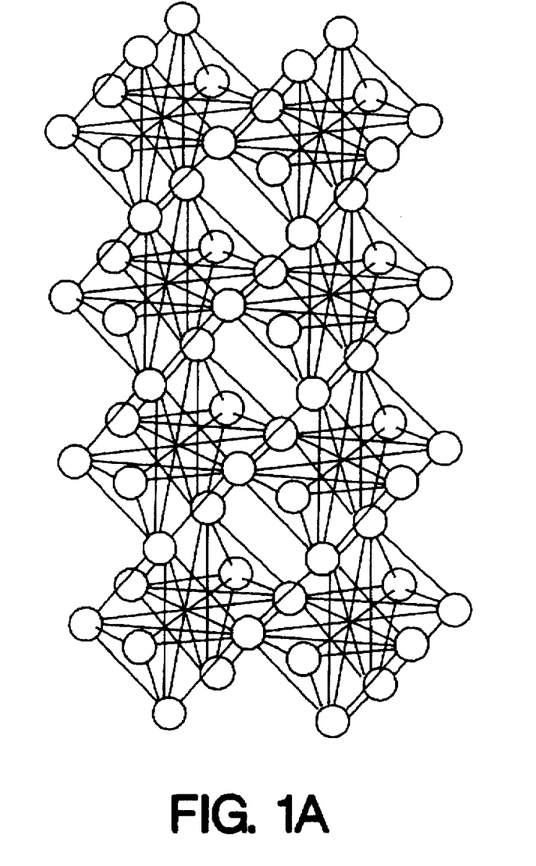
FIG. 1A is a fragmentary illustrative view of a crystal structure of a magnetic oxide represented by $A_{1-x}A'_xMn_{1-y}M_yO_z$, where: A is at least one element selected from the group consisting of lanthanoid, Y and Bi; A' is at least one element selected from the group consisting of alkaline earth metals and Pb; M is at least one element selected from the group consisting of Ni and Cu; $0<x$, $y \leq 0.5$; and $2.5 \leq z \leq 3.5$ in accordance with the present invention.
Figure 1B:
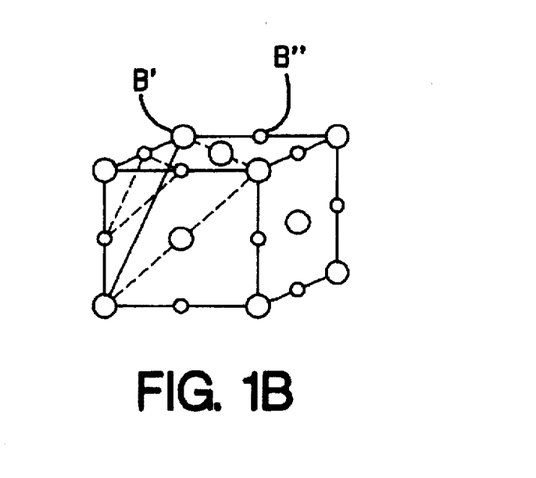
FIG. 1B is a fragmentary illustrative view of a crystal structure at B-site of a magnetic oxide represented by $A_{1-x}A'_xMn_{1-y}M_yO_z$ illustrated in FIG. 1A.

The above magnetic oxide represented by $A_{1-x}A'_xMn_{1-y}M_yO_z$ has a quasi-perovskite crystal structure as illustrated in FIGS. 1A and 1B. The mark ○ represents an oxygen atom. The mark ● represents the A-site at which an element selected from the group consisting of lanthanoid, Y or Bi is positioned. Elements La, Ce, Pr, Nd, Pm, Sm, Eu, Gd, Tb, Dy, Ho, Er, Tm, Yb and Lu are classified as lanthanoid. The mark • represents the B-site at which an element selected from the group consisting of Mn, Ni and Cu is positioned. At each of the A-sites labeled by the mark ●, which element exists is uncertain and random. For example, when y=0.5 and the abundance ratio of Mn to either Ni or Cu is 0.5, it is likely that Mn and either Ni or Cu are alternately arranged at the B-site so that Mn and either Ni or Cu are ordered at B-sites positioned point-symmetrically in relation to the point at which oxygen atom exists. In other words, the elements of Mn, O and either Ni or Cu are aligned in line. Mn exists in ion state. Also Ni and Cu exist in ion states. Mn an ion is different in valance from Ni ion and Cu ion. Mn ion may take either trivalent or tetravalent states whereby the number of electrons on the d-orbital is not more than 5. By contrast, Ni ion or Cu ion may take either divalent or trivalent states whereby the number of electrons on the d-orbital is not less than 5. If the conditions are satisfied that the number of electrons on the d-orbital of Mn ion is not more than 5 whilst the number of electrons on the d-orbital of Ni ion or Cu ion is not less than 5 provided Mn, O and either Ni or Cu are aligned in line namely Mn and either Ni or Cu are almost or nearly ordered point-symmetrically in relation to oxygen atom, then Mn and either Ni or Cu are under the superexchange interaction.

Namely, Mn ion, O ion and either Ni ion or Cu ion are aligned in line. O ion has a circular 2s-orbital. Mn ion, Ni ion and Cu ion have 3d-orbital which are elliptical orbital, wherein a longitudinal axis of the elliptical 3d-orbital of each of Mn ion, Ni ion and Cu ion extends along the line on which Mn ion, O ion and either Ni ion or Cu ion are aligned. The elliptical 3d-orbital of Mn ion overlaps the circular 2s-orbital of O ion. Further, the elliptical 3d-orbital of Ni ion or Cu ion overlaps the circular 2s-orbital of O ion. Thus, the elliptical 3d-orbital of Mn ion is certainly linked to the elliptical 3d-orbital of Ni ion or Cu ion via the circular 2s-orbital of O ion. In view of quantum mechanics, the elliptical 3d-orbital of Mn ion and Ni ion or Cu ion may be interpreted as elliptical and annular electron cloud having a distribution of density corresponding to a probability that electron is found. The circular 2s-orbital of O ion may also be interpreted as circular and annular electron cloud having a distribution of density corresponding to a probability that electron is found. Thus, it may be interpreted that the elliptical and annular electron cloud of the elliptical 3d-orbital of Mn ion overlaps the circular and annular electron cloud of the circular 2s-orbital of O ion as well as the elliptical and annular electron cloud of the elliptical 3d-orbital of Ni ion or Cu ion overlaps the circular and annular electron cloud of the circular 2s-orbital of O ion so that the elliptical and annular electron cloud of the elliptical 3d-orbital of Mn ion is linked to the elliptical and annular electron cloud of the elliptical 3d-orbital of Ni ion or Cu ion via the circular and annular electron cloud of the circular 2s-orbital of O ion. This means that an electron moves between on the 3d-orbital of Mn ion and on the circular 2s-orbital of O ion at a certain probability as well as an electron moves between on the 3d-orbital of Ni or Cu ion and on the circular 2s-orbital of O ion at a certain probability. As described above, Mn ion may take either trivalent state or tetravalent state and Ni ion or Cu ion may take either divalent state or trivalent state. By dropping a temperature of the magnetic oxide, the magnetic oxide enters into ferromagnetic state. This means that spin direction of electrons of Mn ion, O ion and Ni ion or Cu ion are uniform.

Assuming that Mn ion takes trivalent state and Ni ion or Cu ion takes trivalent state, an electron with a certain spin direction on the circular 2s-orbital of O ion moves onto the elliptical 3d-orbital of Mn ion by keeping the spin direction whereby Mn ion enters into the tetravalent state and O ion enters into unstable univalent state. As a result, it is likely that an electron with the same spin direction on the elliptical 3d-orbital of Ni ion or Cu ion moves onto the circular 2s-orbital of O ion by keeping the spin direction whereby Ni ion or Cu ion enters into the divalent state and O ion enters back into the stable divalent state. This may be interpreted that the electron on the elliptical 3d-orbital of Ni ion or Cu ion moves via the circular 2s-orbital of O ion onto the elliptical 3d-orbital of Mn ion by keeping the spin direction. Further, an electron on the circular 2s-orbital of O ion moves onto the elliptical 3d-orbital of Ni ion or Cu ion by keeping the spin direction whereby Ni ion or Cu ion enters into the trivalent state and O ion enters into unstable univalent state. As a result, it is likely that an electron on the elliptical 3d-orbital of Mn ion moves onto the circular 2s-orbital of O ion by keeping the spin direction whereby Mn ion enters into the trivalent state and O ion enters back into the stable divalent state. This may be interpreted that the electron on the elliptical 3d-orbital of Mn ion moves via the circular 2s-orbital of O ion onto the elliptical 3d-orbital of Ni ion or Cu ion by keeping the spin direction.

The above electron exchange process is the electron superexchange interaction between Mn ion and either Ni ion or Cu ion with keeping the spin direction. This electron superexchange interaction facilitates that the spin directions of electrons of Mn ion and either Ni ion or Cu ion are ordered at the same direction like the ferromagnetic material.

Since the Mn ion, O ion and either Ni ion or Cu ion are almost aligned in line and the electron superexchange interaction appears between them, there is a relatively strong interaction between spins of electrons of Mn ion and either Ni ion or Cu ion. For which reason, the magnetic oxide has a ferromagnetic-paramagnetic transition temperature near room temperature. This means that spin disorder of electrons of the magnetic oxide is sufficiently repaired by an application of a relatively weak magnetic field and the spin is ordered whereby the resistance is remarkably reduced. This further means that a small increase in intensity of the magnetic field applied to the magnetic oxide causes a remarkable reduction in resistivity of the magnetic oxide. This means that the magnetic oxide has an extremely high sensitivity to small variation of weak magnetic field.

The present invention also provides a second magnetic oxide represented by $(A'_{1-x}A_x)_{n+1}(Mn_{1-y}M_y)_nO_z$, where: A is at least one element selected from the group consisting of lanthanoid, Y and Bi; A' is at least one element selected from the group consisting of alkaline earth metals and Pb; M is at least one element selected from the group consisting of Ni and Cu; $0 \leq x, y \leq 0.5$; and $3n \leq z \leq 3n+2$, n=1, 2, 3.

The above magnetic oxide shows a large magnetoresistive effect at room temperature and a large variation in magnetoresistance at room temperature. The above magnetic oxide has an atomic structure allowing a repair of spin disorder of electrons in the magnetic oxide by application of a weak magnetic field to obtain a small saturation magnetic field. The above magnetic oxide also has a transition temperature from ferromagnetism into paramagnets, wherein the transition temperature is near room temperature so as to obtain a large variation of magnetoresistance thereof to room temperature.

The above magnetic oxide represented by $(A'_{1-x}A_x)_{n+1}(Mn_{1-y}M_y)_nO_z$ has a quasi-perovskite crystal structure like the first magnetic oxide. Mn and either Ni or Cu are ordered point-symmetrically in relation to the point at which oxygen atom exists. In other words, the elements of Mn, O and either Ni or Cu are aligned in line. Mn exists in ion state. Also Ni and Cu exist in ion states. Mn ion is different in valance from Ni ion and Cu ion. Mn ion may take either trivalent or tetravalent states whereby the number of electrons on the d-orbital is not more than 5. By contrast, Ni ion or Cu ion may take either divalent or trivalent states whereby the number of electrons on the d-orbital is not less than 5. If the conditions are satisfied that the number of electrons on the d-orbital of Mn ion is not more than 5 whilst the number of electrons on the d-orbital of Ni ion or Cu ion is not less than 5 provided Mn, O and either Ni or Cu are aligned in line namely Mn and either Ni or Cu are almost or nearly ordered point-symmetrically in relation to oxygen atom, then Mn and either Ni or Cu are under the superexchange interaction.

Namely, Mn ion, O ion and either Ni ion or Cu ion are aligned in line. O ion has a circular 2s-orbital. Mn ion, Ni ion and Cu ion have 3d-orbital which are elliptical orbital, wherein a longitudinal axis of the elliptical 3d-orbital of each of Mn ion, Ni ion and Cu ion extends along the line on which Mn ion, O ion and either Ni ion or Cu ion are aligned. The elliptical 3d-orbital of Mn ion overlaps the circular 2s-orbital of O ion. Further, the elliptical 3d-orbital of Ni ion or Cu ion overlaps the circular 2s-orbital of O ion. Thus, the elliptical 3d-orbital of Mn ion is certainly linked to the elliptical 3d-orbital of Ni ion or Cu ion via the circular 2s-orbital of O ion. In view of quantum mechanics, the elliptical 3d-orbital of Mn ion and Ni ion or Cu ion may be interpreted as elliptical and annular electron cloud having a distribution of density corresponding to a probability that electron is found. The circular 2s-orbital of O ion may also be interpreted as circular and annular electron cloud having a distribution of density corresponding to a probability that electron is found. Thus, it may be interpreted that the elliptical and annular electron cloud of the elliptical 3d-orbital of Mn ion overlaps the circular and annular electron cloud of the circular 2s-orbital of O ion as well as the elliptical and annular electron cloud of the elliptical 3d-orbital of Ni ion or Cu ion overlaps the circular and annular electron cloud of the circular 2s-orbital of O ion so that the elliptical and annular electron cloud of the elliptical 3d-orbital of Mn ion is linked to the elliptical and annular electron cloud of the elliptical 3d-orbital of Ni ion or Cu ion via the circular and annular electron cloud of the circular 2s-orbital of O ion. This means that an electron moves between on the 3d-orbital of Mn ion and on the circular 2s-orbital of O ion at a certain probability as well as an electron moves between on the 3d-orbital of Ni or Cu ion and on the circular 2s-orbital of O ion at a certain probability. As described above, Mn ion may take either trivalent state or tetravalent state and Ni ion or Cu ion may take either divalent state or trivalent state. By dropping a temperature of the magnetic oxide, the magnetic oxide enters into ferromagnetic state. This means that spin direction of electrons of Mn ion, O ion and Ni ion or Cu ion are uniform.

Assuming that Mn ion takes trivalent state and Ni ion or Cu ion takes trivalent state, an electron with a certain spin direction on the circular 2s-orbital of O ion moves onto the elliptical 3d-orbital of Mn ion by keeping the spin direction whereby Mn ion enters into the tetravalent state and O ion enters into unstable univalent state. As a result, it is likely that an electron with the same spin direction on the elliptical 3d-orbital of Ni ion or Cu ion moves onto the circular 2s-orbital of O ion by keeping the spin direction whereby Ni ion or Cu ion enters into the divalent state and O ion enters back into the stable divalent state. This may be interpreted that the electron on the elliptical 3d-orbital of Ni ion or Cu ion moves via the circular 2s-orbital of O ion onto the elliptical 3d-orbital of Mn ion by keeping the spin direction. Further, an electron on the circular 2s-orbital of O ion moves onto the elliptical 3d-orbital of Ni ion or Cu ion by keeping the spin direction whereby Ni ion or Cu ion enters into the trivalent state and O ion enters into unstable univalent state. As a result, it is likely that an electron on the elliptical 3d-orbital of Mn ion moves onto the circular 2s-orbital of O ion by keeping the spin direction whereby Mn ion enters into the trivalent state and O ion enters back into the stable divalent state. This may be interpreted that the electron on the elliptical 3d-orbital of Mn ion moves via the circular 2s-orbital of O ion onto the elliptical 3d-orbital of Ni ion or Cu ion by keeping the spin direction.

The above electron exchange process is the electron superexchange interaction between Mn ion and either Ni ion or Cu ion with keeping the spin direction. This electron superexchange interaction facilitates that the spin directions of electrons of Mn ion and either Ni ion or Cu ion are ordered at the same direction like the ferromagnetic material.

Since the Mn ion, O ion and either Ni ion or Cu ion are almost aligned in line and the electron superexchange interaction appears between them, there is a relatively strong interaction between spins of electrons of Mn ion and either Ni ion or Cu ion. For which reason, the magnetic oxide has a ferromagnetic-paramagnetic transition temperature near room temperature. This means that spin disorder of electrons of the magnetic oxide is sufficiently repaired by an application of a relatively weak magnetic field and the spin is ordered whereby the resistance is remarkably reduced. This further means that a small increase in intensity of the magnetic field applied to the magnetic oxide causes a remarkable reduction in resistivity of the magnetic oxide. This means that the magnetic oxide has an extremely high sensitivity to small variation of weak magnetic field.

The present invention also provides a third magnetic oxide represented by $(BiO)_2[(A_{1-x}A'_x)_n(Mn_{1-y}M_y)_{n+1}O_z]$, where: A is at least one element selected from the group consisting of lanthanoid, Y and Bi; A' is at least one element selected from the group consisting of alkaline earth metals and Pb; M is at least one element selected from the group consisting of Ta, Nb, Ti and Zr; $0 \leq x \leq 0.5$; $0 \leq y < 1$; and $2n+2 \leq z \leq 3n+4$, $n=2, 3, 4, 5$.

The above magnetic oxide shows a large magnetoresistive effect at room temperature and a large variation in magnetoresistance at room temperature. The above magnetic oxide has an atomic structure allowing a repair of spin disorder of electrons in the magnetic oxide by application of a weak magnetic field to obtain a small saturation magnetic field. The above magnetic oxide also has a transition temperature from ferromagnetism into paramagnets, wherein the transition temperature is near room temperature so as to obtain a large variation of magnetoresistance thereof to room temperature.

Figure 2A:
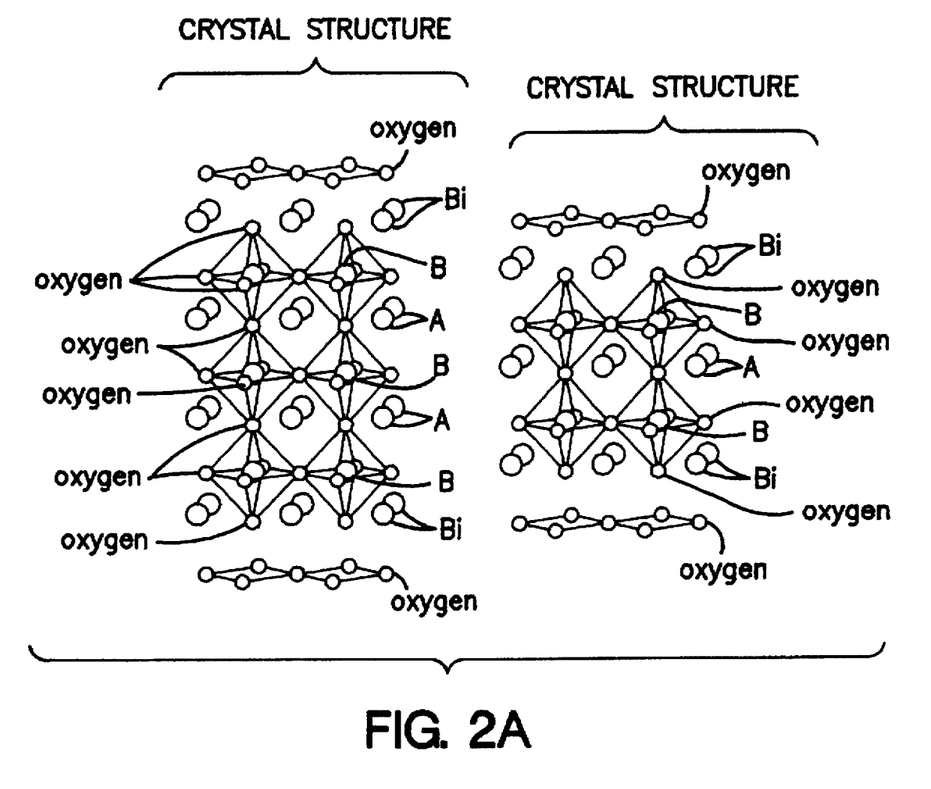
FIG. 2A is a fragmentary illustrative view of crystal structures of a magnetic oxide represented by $(BiO)_2[(A_{1-x}A'_x)_n(Mn_{1-y}M_y)_{n+1}O_z]$ for n=2 and M=3, where: A is at least one element selected from the group consisting of lanthanoid, Y and Bi; A' is at least one element selected from the group consisting of alkaline earth metals and Pb; M is at least one element selected from the group consisting of Ta, Nb, Ti and Zr; $0 \leq x \leq 0.5$; $0 \leq y < 1$; and $2n+2 \leq z \leq 3n+4$, n=2, 3, 4, 5 in accordance with the present invention.

The above magnetic oxide represented by $(BiO)_2[(A_{1-x}A'_x)_n(Mn_{1-y}M_y)_{n+1}O_z]$ has a quasi-perovskite crystal structure as illustrated in FIG. 2A. It is likely that Mn and either Ni or Cu are alternately arranged at the B-site so that Mn and either Ni or Cu are ordered point-symmetrically in relation to the point at which oxygen atom exists. In other words, the elements of Mn, O and either Ni or Cu are aligned in line. Mn exists in ion state. Also Ni and Cu exist in ion states. Mn ion is different in valance from Ni ion and Cu ion. Mn ion may take either trivalent or tetravalent states whereby the number of electrons on the d-orbital is not more than 5. By contrast, Ni ion or Cu ion may take either divalent or trivalent states whereby the number of electrons on the d-orbital is not less than 5. If the conditions are satisfied that the number of electrons on the d-orbital of Mn ion is not more than 5 whilst the number of electrons on the d-orbital of Ni ion or Cu ion is not less than 5 provided Mn, O and either Ni or Cu are aligned in line namely Mn and either Ni or Cu are almost or nearly ordered point-symmetrically in relation to oxygen atom, then Mn and either Ni or Cu are under the superexchange interaction.

Namely, Mn ion, O ion and either Ni ion or Cu ion are aligned in line. O ion has a circular 2s-orbital. Mn ion, Ni ion and Cu ion have 3d-orbital which are elliptical orbital, wherein a longitudinal axis of the elliptical 3d-orbital of each of Mn ion, Ni ion and Cu ion extends along the line on which Mn ion, O ion and either Ni ion or Cu ion are aligned. The elliptical 3d-orbital of Mn ion overlaps the circular 2s-orbital of O ion. Further, the elliptical 3d-orbital of Ni ion or Cu ion overlaps the circular 2s-orbital of O ion. Thus, the elliptical 3d-orbital of Mn ion is certainly linked to the elliptical 3d-orbital of Ni ion or Cu ion via the circular 2s-orbital of O ion. In view of quantum mechanics, the elliptical 3d-orbital of Mn ion and Ni ion or Cu ion may be interpreted as elliptical and annular electron cloud having a distribution of density corresponding to a probability that electron is found. The circular 2s-orbital of O ion may also be interpreted as circular and annular electron cloud having a distribution of density corresponding to a probability that electron is found. Thus, it may be interpreted that the elliptical and annular electron cloud of the elliptical 3d-orbital of Mn ion overlaps the circular and annular electron cloud of the circular 2s-orbital of O ion as well as the elliptical and annular electron cloud of the elliptical 3d-orbital of Ni ion or Cu ion overlaps the circular and annular electron cloud of the circular 2s-orbital of O ion so that the elliptical and annular electron cloud of the elliptical 3d-orbital of Mn ion is linked to the elliptical and annular electron cloud of the elliptical 3d-orbital of Ni ion or Cu ion via the circular and annular electron cloud of the circular 2s-orbital of O ion. This means that an electron moves between on the 3d-orbital of Mn ion and on the circular 2s-orbital of O ion at a certain probability as well as an electron moves between on the 3d-orbital of Ni or Cu ion and on the circular 2s-orbital of O ion at a certain probability. As described above, Mn ion may take either trivalent state or tetravalent state and Ni ion or Cu ion may take either divalent state or trivalent state. By dropping a temperature of the magnetic oxide, the magnetic oxide enters into ferromagnetic state. This means that spin direction of electrons of Mn ion, O ion and Ni ion or Cu ion are uniform.

Assuming that Mn ion takes trivalent state and Ni ion or Cu ion takes divalent state, an electron with a certain spin direction on the circular 2s-orbital of O ion moves onto the elliptical 3d-orbital of Mn ion by keeping the spin direction whereby Mn ion enters into the tetravalent state and O ion enters into unstable univalent state. As a result, it is likely that an electron with the same spin direction on the elliptical 3d-orbital of Ni ion or Cu ion moves onto the circular 2s-orbital of O ion by keeping the spin direction whereby Ni ion or Cu ion enters into the divalent state and O ion enters back into the stable divalent state. This may be interpreted that the electron on the elliptical 3d-orbital of Ni ion or Cu ion moves via the circular 2s-orbital of O ion onto the elliptical 3d-orbital of Mn ion by keeping the spin direction. Further, an electron on the circular 2s-orbital of O ion moves onto the elliptical 3d-orbital of Ni ion or Cu ion by keeping the spin direction whereby Ni ion or Cu ion enters into the trivalent state and O ion enters into unstable univalent state. As a result, it is likely that an electron on the elliptical 3d-orbital of Mn ion moves onto the circular 2s-orbital of O ion by keeping the spin direction whereby Mn ion enters into the trivalent state and O ion enters back into the stable divalent state. This may be interpreted that the electron on the elliptical 3d-orbital of Mn ion moves via the circular 2s-orbital of O ion onto the elliptical 3d-orbital of Ni ion or Cu ion by keeping the spin direction.

The above electron exchange process is the electron superexchange interaction between Mn ion and either Ni ion or Cu ion with keeping the spin direction. This electron superexchange interaction facilitates that the spin directions of electrons of Mn ion and either Ni ion or Cu ion are ordered at the same direction like the ferromagnetic material.

Since the Mn ion, O ion and either Ni ion or Cu ion are almost aligned in line and the electron superexchange interaction appears between them, there is a relatively strong interaction between spins of electrons of Mn ion and either Ni ion or Cu ion. For which reason, the magnetic oxide has a ferromagnetic-paramagnetic transition temperature near room temperature. This means that spin disorder of electrons of the magnetic oxide is sufficiently repaired by an application of a relatively weak magnetic field and the spin is ordered whereby the resistance is remarkably reduced. This further means that a small increase in intensity of the magnetic field applied to the magnetic oxide causes a remarkable reduction in resistivity of the magnetic oxide. This means that the magnetic oxide has an extremely high sensitivity to small variation of weak magnetic field.

In addition, as illustrated in FIG. 2A, the perovskite structures represented by $[(A_{1-x}A'_x)_n(Mn_{1-y}M_y)_{n+1}O_z]$ are separated from each other by the layer represented by $(BiO)_2$. The spins of electrons between $MnO_2$ planes sandwiching the layer represented by $(BiO)_2$ are weakly bonded to each other via the layer represented by $(BiO)_2$. This weak bonding between the spins of electrons between $MnO_2$ planes sandwiching the layer represented by $(BiO)_2$ allows that the spin disorder of electrons is sufficiently repaired by an application of a relatively weak magnetic field and the spin is ordered whereby the resistance is further remarkably reduced as well as it is possible to further reduce a saturation magnetic field. This means that a small increase in intensity of the magnetic field applied to the magnetic oxide causes a further remarkable reduction in resistivity of the magnetic oxide. This means that the magnetic oxide has an extremely high sensitivity to small variation of weak magnetic field.

The present invention also provides a fourth magnetic oxide represented by $(Bi_{1-x}B_xO)_2[A_{n+1}(Mn_{1-y}M_y)_nO_z]$, where: A is at least one element selected from the group consisting of lanthanoid; B is at least one element selected from the group consisting of Pb and Tl; M is at least one element selected from the group consisting of Ni and Cu; $0.5 \leq x \leq 1$; $0 \leq y \leq 0.5$; and $2n+2 \leq z \leq 3n+2$, $n=1, 2, 3, 4$.

The above magnetic oxide shows a large magnetoresistive effect at room temperature and a large variation in magnetoresistance at room temperature. The above magnetic oxide has an atomic structure allowing a repair of spin disorder of electrons in the magnetic oxide by application of a weak magnetic field to obtain a small saturation magnetic field. The above magnetic oxide also has a transition temperature from ferromagnetism into paramagnets, wherein the transition temperature is near room temperature so as to obtain a large variation of magnetoresistance thereof to room temperature.

Figure 2B:
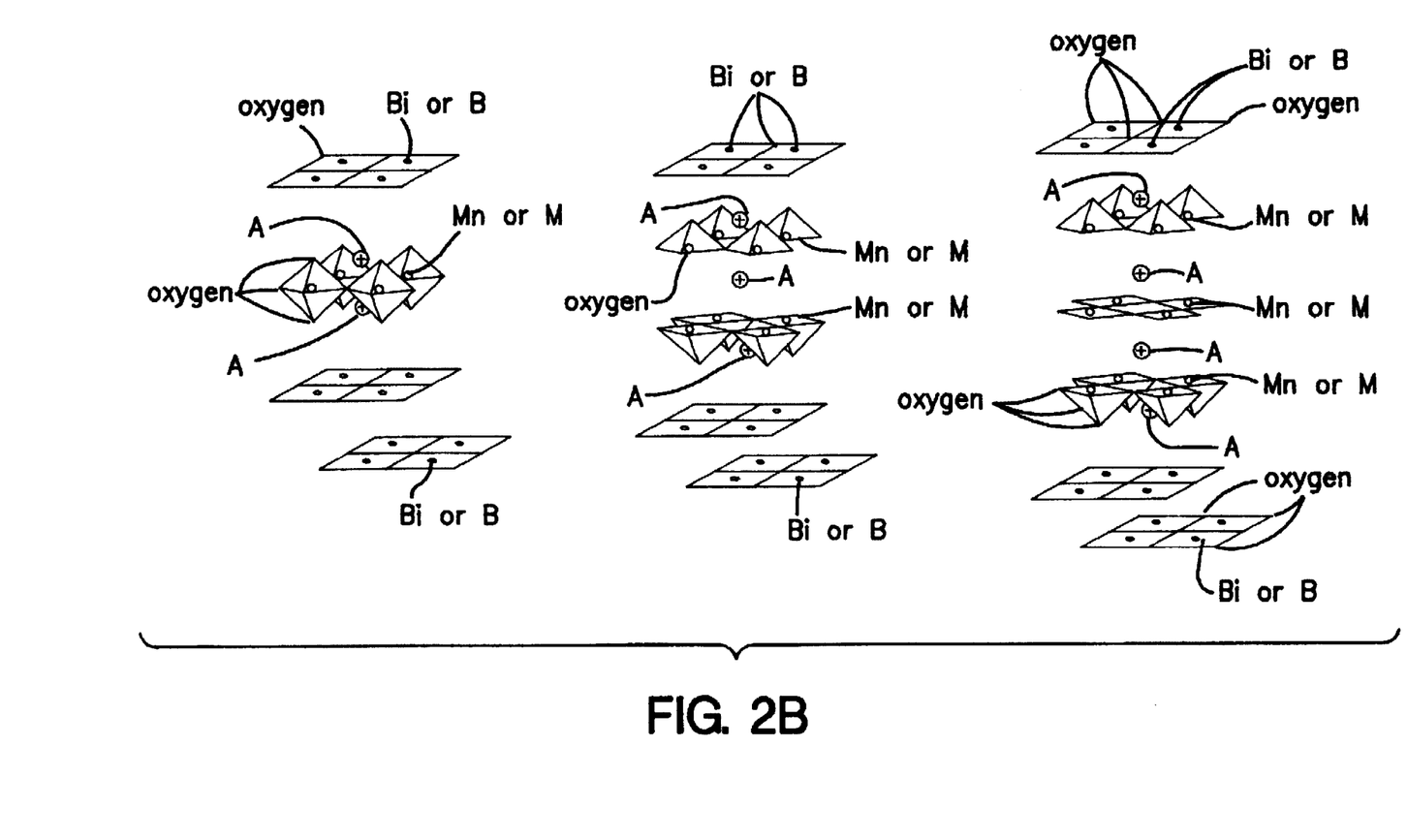
FIG. 2B is a fragmentary illustrative view of a crystal structure of a magnetic oxide represented by $(Bi_{1-x}B_xO)_2$ $[A_{n+1}(Mn_{1-y}M_y)_nO_z]$, where: A is at least one element selected from the group consisting of lanthanoid; B is at least one element selected from the group consisting of Pb and Tl; M is at least one element selected from the group consisting of Ni and Cu; $0.5 \leq x \leq 1$; $0 \leq y \leq 0.5$; and $2n+2 \leq z \leq 3n+2$, n=1, 2, 3, 4 in accordance with the present invention.

The above magnetic oxide represented by $(Bi_{1-x}B_xO)_2[A_{n+1}(Mn_{1-y}M_y)_nO_z]$ has a quasi-perovskite crystal structure as illustrated in FIG. 2B. It is likely that Mn and either Ni or Cu are alternately arranged at the B-site so that Mn and either Ni or Cu are ordered point-symmetrically in relation to the point at which oxygen atom exists. In other words, the elements of Mn, O and either Ni or Cu are aligned in line. Mn exists in ion state. Also Ni and Cu exist in ion states. Mn ion is different in valance from Ni ion and Cu ion. Mn ion may take either trivalent or tetravalent states whereby the number of electrons on the d-orbital is not more than 5. By contrast, Ni ion or Cu ion may take either divalent or trivalent states whereby the number of electrons on the d-orbital is not less than 5. If the conditions are satisfied that the number of electrons on the d-Orbital of Mn ion is not more than 5 whilst the number of electrons on the d-orbital of Ni ion or Cu ion is not less than 5 provided Mn, O and either Ni or Cu are aligned in line namely Mn and either Ni or Cu are almost or nearly ordered point-symmetrically in relation to oxygen atom, then Mn and either Ni or Cu are under the superexchange interaction.

Namely, Mn ion, O ion and either Ni ion or Cu ion are aligned in line. O ion has a circular 2s-orbital. Mn ion, Ni ion and Cu ion have 3d-orbital which are elliptical orbital, wherein a longitudinal axis of the elliptical 3d-orbital of each of Mn ion, Ni ion and Cu ion extends along the line on which Mn ion, O ion and either Ni ion or Cu ion are aligned. The elliptical 3d-orbital of Mn ion overlaps the circular 2s-orbital of O ion. Further, the elliptical 3d-orbital of Ni ion or Cu ion overlaps the circular 2s-orbital of O ion. Thus, the elliptical 3d-orbital of Mn ion is certainly linked to the elliptical 3d-orbital of Ni ion or Cu ion via the circular 2s-orbital of O ion. In view of quantum mechanics, the elliptical 3d-orbital of Mn ion and Ni ion or Cu ion may be interpreted as elliptical and annular electron cloud having a distribution of density corresponding to a probability that electron is found. The circular 2s-orbital Of O ion may also be interpreted as circular and annular electron cloud having a distribution of density corresponding to a probability that electron is found. Thus, it may be interpreted that the elliptical and annular electron cloud of the elliptical 3d-orbital of Mn ion overlaps the circular and annular electron cloud of the circular 2s-orbital of O ion as well as the elliptical and annular electron cloud of the elliptical 3d-orbital of Ni ion or Cu ion overlaps the circular and annular electron cloud of the circular 2s-orbital of O ion so that the elliptical and annular electron cloud of the elliptical 3d-orbital of Mn ion is linked to the elliptical and annular electron cloud of the elliptical 3d-orbital of Ni ion or Cu ion via the circular and annular electron cloud of the circular 2s-orbital of O ion. This means that an electron moves between on the 3d-orbital of Mn ion and on the circular 2s-orbital of O ion at a certain probability as well as an electron moves between on the 3d-orbital of Ni or Cu ion and on the circular 2s-orbital of O ion at a certain probability. As described above, Mn ion may take either trivalent state or tetravalent state and Ni ion or Cu ion may take either divalent state or trivalent state. By dropping a temperature of the magnetic oxide, the magnetic oxide enters into ferromagnetic state. This means that spin direction of electrons of Mn ion, O ion and Ni ion or Cu ion are uniform.

Assuming that Mn ion takes trivalent state and Ni ion or Cu ion takes trivalent state, an electron with a certain spin direction on the circular 2s-orbital of O ion moves onto the elliptical 3d-orbital of Mn ion by keeping the spin direction whereby Mn ion enters into the tetravalent state and O ion enters into unstable univalent state. As a result, it is likely that an electron with the same spin direction on the elliptical 3d-orbital of Ni ion or Cu ion moves onto the circular 2s-orbital of O ion by keeping the spin direction whereby Ni ion or Cu ion enters into the divalent state and O ion enters back into the stable divalent state. This may be interpreted that the electron on the elliptical 3d-orbital of Ni ion or Cu ion moves via the circular 2s-orbital of O ion onto the elliptical 3d-orbital of Mn ion by keeping the spin direction. Further, an electron on the circular 2s-orbital of O ion moves onto the elliptical 3d-orbital of Ni ion or Cu ion by keeping the spin direction whereby Ni ion or Cu ion enters into the trivalent state and O ion enters into unstable univalent state. As a result, it is likely that an electron on the elliptical 3d-orbital of Mn ion moves onto the circular 2s-orbital of O ion by keeping the spin direction whereby Mn ion enters into the trivalent state and O ion enters back into the stable divalent state. This may be interpreted that the electron on the elliptical 3d-orbital of Mn ion moves via the circular 2s-orbital of O ion onto the elliptical 3d-orbital of Ni ion or Cu ion by keeping the spin direction.

The above electron exchange process is the electron superexchange interaction between Mn ion and either Ni ion or Cu ion with keeping the spin direction. This electron superexchange interaction facilitates that the spin directions of electrons of Mn ion and either Ni ion or Cu ion are ordered at the same direction like the ferromagnetic material.

Since the Mn ion, O ion and either Ni ion or Cu ion are almost aligned in line and the electron superexchange interaction appears between them, there is a relatively strong interaction between spins of electrons of Mn ion and either Ni ion or Cu ion. For which reason, the magnetic oxide has a ferromagnetic-paramagnetic transition temperature near room temperature. This means that spin disorder of electrons of the magnetic oxide is sufficiently repaired by an application of a relatively weak magnetic field and the spin is ordered whereby the resistance is remarkably reduced. This further means that a small increase in intensity of the magnetic field applied to the magnetic oxide causes a remarkable reduction in resistivity of the magnetic oxide. This means that the magnetic oxide has an extremely high sensitivity to small variation of weak magnetic field.

In addition, as illustrated in FIG. 2, the perovskite structures represented by $[(A_{1-x}A'_x)_n(Mn_{1-y}M_y)_{n+1}O_z]$ are separated from each other by the layer represented by $(BiO)_2$. The spins of electrons between $MnO_2$ planes sandwiching the layer represented by $(BiO)_2$ are weakly bonded to each other via the layer represented by $(BiO)_2$. This weak bonding between the spins of electrons between $MnO_2$ planes sandwiching the layer represented by $(BiO)_2$ allows that the spin disorder of electrons is sufficiently repaired by an application of a relatively weak magnetic field and the spin is ordered whereby the resistance is further remarkably reduced as well as it is possible to further reduce a saturation magnetic field. This means that a small increase in intensity of the magnetic field applied to the magnetic oxide causes a further remarkable reduction in resistivity of the magnetic oxide. This means that the magnetic oxide has an extremely high sensitivity to small variation of weak magnetic field.

The present invention also provides a highly sensitive magnetic detector comprising a first magnetic oxide represented by $A_{1-x}A'_xMn_{1-y}M_yO_z$, where: A is at least one element selected from the group consisting of lanthanoid, Y and Bi; A' is at least one element selected from the group consisting of alkaline earth metals and Pb; M is at least one element selected from the group consisting of Ni and Cu; $0<x$, $y \leq 0.5$; and $2.5 \leq z \leq 3.5$; and a pair of electrodes provided on said magnetic oxide and being separated from each other via said magnetic oxide.

The above highly sensitive magnetic detector utilizing the magnetic oxide shows a large magnetoresistive effect at room temperature and a large variation in magnetoresistance at room temperature. The above highly sensitive magnetic detector utilizing the magnetic oxide has an atomic structure allowing a repair of spin disorder of electrons in the magnetic oxide by application of a weak magnetic field to obtain a small saturation magnetic field. The above highly sensitive magnetic detector utilizing the magnetic oxide also has a transition temperature from ferromagnetism into paramagnets, wherein the transition temperature is near room temperature so as to obtain a large variation of magnetoresistance thereof to room temperature.

Figure 3:
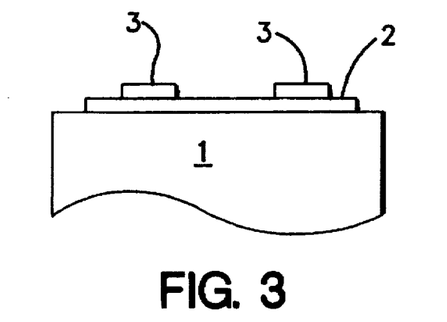
FIG. 3 is a fragmentary cross sectional view illustrative of a highly sensitive magnetic detector utilizing a novel magnetic oxide in accordance with the present invention.

It is possible to practice the above invention by making a magnetic sensor illustrated in FIG. 3. The above magnetic oxide is shaped into a plate 2 and placed on a body 1. A pair of electrodes 3 are provided on the top surface of the plate-like magnetic oxide 2, wherein the electrodes 3 are spaced apart from each other. The electrodes are for both a current detection and a voltage application.

As a modification, it is possible to provide a first pair of electrodes for voltage application and a second pair of electrodes for current detection separately.

Figure 4:
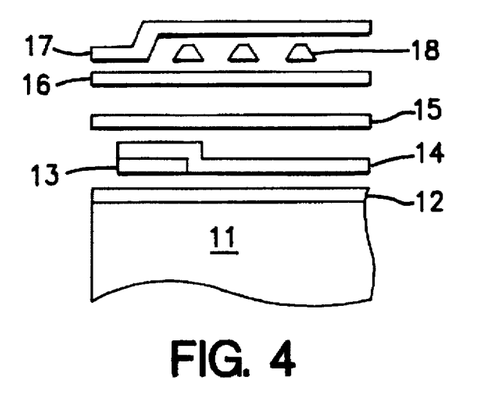
FIG. 4 is a fragmentary cross sectional view illustrative of a highly sensitive complex magnetic head detector utilizing a novel magnetic oxide in accordance with the present invention.

As a further modification, it is possible to configure the magnetic sensor as illustrated in FIG. 4. A bottom magnetic shielding film 12 is provided on a body 11. A magnetic oxide film 13 is placed over the bottom magnetic shielding film 12. Electrodes 14 are provided to be connected to the magnetic oxide film 13. A top magnetic shielding film 15 is provided over the electrodes 14. A bottom magnetic film 16 is provided over the top magnetic shielding film 15. Magnetic coils 18 are provided over the bottom magnetic film 16. A top magnetic field 17 is provided over the magnetic coils 18.

Figure 5:
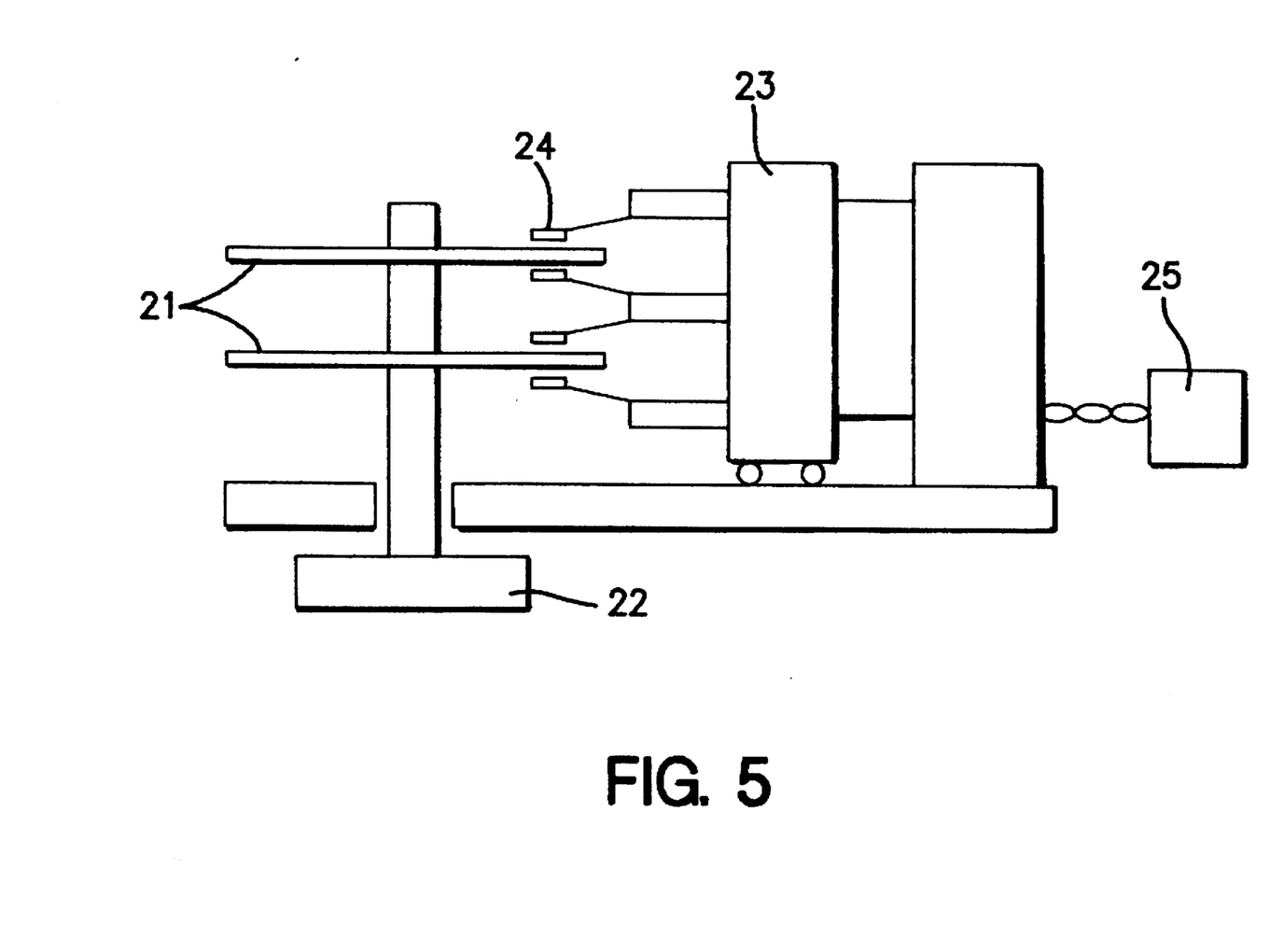
FIG. 5 is a fragmentary cross sectional view illustrative of a magnetic disk driver having a highly sensitive complex magnetic head detector utilizing a novel magnetic oxide in accordance with the present invention.

As a still further modification, it is possible to configure the complex magnetic heads as illustrated in FIG. 5. Two disks are rotated by a spindle motor 22. Head sliders 24 are guided on the two disks 21 under the control by an actuator 23. Information detected by the head sliders 24 are processed by a signal processor 25. This system is the conventional system. The novel magnetic oxide may be applicable to the magnetic head used in this system.

The present invention also provides a highly sensitive magnetic detector comprising a second magnetic oxide represented by $(A'_{1-x}A_x)_{n+1}(Mn_{1-y}M_y)_nO_z$, where: A is at least one element selected from the group consisting of lanthanoid, Y and Bi; A' is at least one element selected from the group consisting of alkaline earth metals and Pb; M is at least one element selected from the group consisting of Ni and Cu; $0<x$, $y \leq 0.5$; and $3n \leq z \leq 3n+2$, $n=1, 2, 3$; and a pair of electrodes provided on said magnetic oxide and being separated from each other via said magnetic oxide.

The above highly sensitive magnetic detector utilizing the magnetic oxide shows a large magnetoresistive effect at room temperature and a large variation in magnetoresistance at room temperature. The above highly sensitive magnetic detector utilizing the magnetic oxide has an atomic structure allowing a repair of spin disorder of electrons in the magnetic oxide by application of a weak magnetic field to obtain a small saturation magnetic field. The above highly sensitive magnetic detector utilizing the magnetic oxide also has a transition temperature from ferromagnetism into paramagnets, wherein the transition temperature is near room temperature so as to obtain a large variation of magnetoresistance thereof to room temperature.

The present invention also provides a highly sensitive magnetic detector comprising a third magnetic oxide represented by $(BiO)_2[(A_{1-x}A'_x)_n(Mn_{1-y}M_y)_{n+1}O_z]$, where: A is at least one element selected from the group consisting of lanthanoid, Y and Bi; A' is at least one element selected from the group consisting of alkaline earth metals and Pb; M is at least one element selected from the group consisting of Ta, Nb, Ti and Zr; $0 \leq x \leq 0.5$; $0 \leq y < 1$; and $2n+2 \leq z \leq 3n+4$, n=2, 3, 4, 5; and a pair of electrodes provided on said magnetic oxide and being separated from each other via said magnetic oxide.

The above highly sensitive magnetic detector utilizing the magnetic oxide shows a large magnetoresistive effect at room temperature and a large variation in magnetoresistance at room temperature. The above highly sensitive magnetic detector utilizing the magnetic oxide has an atomic structure allowing a repair of spin disorder of electrons in the magnetic oxide by application of a weak magnetic field to obtain a small saturation magnetic field. The above highly sensitive magnetic detector utilizing the magnetic oxide also has a transition temperature from ferromagnetism into paramagnets, wherein the transition temperature is near room temperature so as to obtain a large variation of magnetoresistance thereof to room temperature.

The present invention also provides a highly sensitive magnetic detector comprising a fourth magnetic oxide represented by $(Bi_{1-x}B_xO)_2[A_{n+1}(Mn_{1-y}M_y)_nO_z]$, where: A is at least one element selected from the group consisting of lanthanoid; B is at least one element selected from the group consisting of Pb and Tl; M is at least one element selected from the group consisting of Ni and Cu; $0.5 \leq x \leq 1$; $0 \leq y \leq 0.5$; and $2n+2 \leq z \leq 3n+2$, n=1, 2, 3, 4; and a pair of electrodes provided on said magnetic oxide and being separated from each other via said magnetic oxide.

The above highly sensitive magnetic detector utilizing the magnetic oxide shows a large magnetoresistive effect at room temperature and a large variation in magnetoresistance at room temperature. The above highly sensitive magnetic detector utilizing the magnetic oxide has an atomic structure allowing a repair of spin disorder of electrons in the magnetic oxide by application of a weak magnetic field to obtain a small saturation magnetic field. The above highly sensitive magnetic detector utilizing the magnetic oxide also has a transition temperature from ferromagnetism into paramagnets, wherein the transition temperature is near room temperature so as to obtain a large variation of magnetoresistance thereof to room temperature.

EMBODIMENTS

Figure 6:
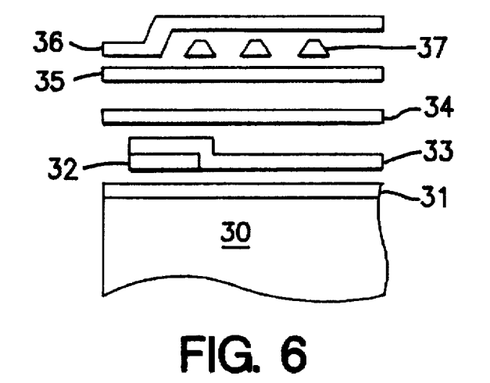
FIG. 6 is a fragmentary cross sectional view illustrative of a highly sensitive complex magnetic head detector utilizing a novel magnetic oxide in a first embodiment according to the present invention.

A first embodiment according to the present invention will be described in detail with reference to FIG. 6, wherein the novel magnetic oxide $La_{0.7}Sr_{0.3}Mn_{0.5}Ni_{0.5}O_3$ is applied to a complex magnetic head. A bottom magnetic shielding film 31 is provided on a body 30. A magnetic oxide film 32 made of $La_{0.7}Sr_{0.3}Mn_{0.5}Ni_{0.5}O_3$ is placed over the bottom magnetic shielding film 31. Electrodes 33 are provided to be connected to the magnetic oxide film 32. A top magnetic shielding film 34 is provided over the electrodes 33. A bottom magnetic film 35 is provided over the top magnetic shielding film 34. Magnetic coils 37 are provided over the bottom magnetic film 35. A top magnetic field 36 is provided over the magnetic coils 37.

The head 32 made of $La_{0.7}Sr_{0.3}Mn_{0.5}Ni_{0.5}O_3$ is an inductive type head. The body is made of $Al_2O_3$-TiC complex ceramics. The top and bottom magnetic shielding films 34 and 31 are provided for shielding the head 32 from any leaked magnetic field. The head 32 made of the magnetic oxide represented by $La_{0.7}Sr_{0.3}Mn_{0.5}Ni_{0.5}O_3$ is formed by a laser ablation method under the conditions mentioned on Table 1.

TABLE 1

| $La_{0.7}Sr_{0.3}Mn_{0.5}Ni_{0.5}O_3$ | |
| --- | --- |
| Target Component | $La_{0.7}Sr_{0.3}Mn_{0.5}Ni_{0.5}O_3$ |
| Laser wavelength | 248 nanometers (ArF) |
| Laser Power | 0.5–2 J/cm$^2$, 5–10 Hz |
| Reaction Gas | Oxygen |
| Gas Pressure | 100–200 mTorr (cooling it under 100 Torr follows to the growth process) |
| Substrate Temperature | 600–700° C. |
| Thickness | 150–200 manometers |

The head 32 made of $La_{0.7}Sr_{0.3}Mn_{0.5}Ni_{0.5}O_3$ shows −30% of magnetoresistance variation at room temperature in a magnetic field of 1000 Oe. The magnetoresistance is isotropic. It is confirmed that if the head is subjected to an annealing at a temperature in the range of 400°–600° C. in an oxygen atmosphere, then the rate of variation of the magnetoresistance is increased and the sensitivity of the sensor or detector is accordingly improved.

As modifications, it is possible to replace La by Y, Pr, Nd, Eu, Dy, Yb, or Bi as well as replace Sr by Ca, Ba and Pb, in addition place Ni by Cu.

Figure 7:
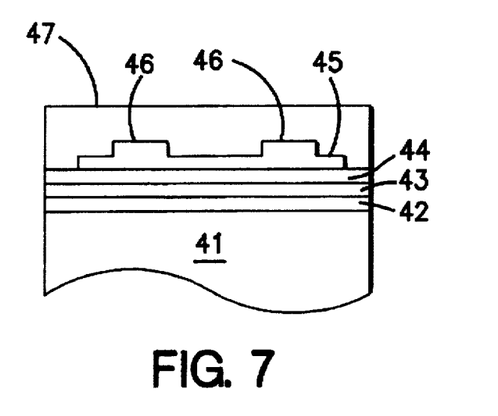
FIG. 7 is a fragmentary cross sectional view illustrative of a highly sensitive complex magnetic head detector utilizing a novel magnetic oxide in a second embodiment according to the present invention.

A second embodiment according to the present invention will be described in detail with reference to FIG. 7, wherein the novel magnetic oxide $(Y_{0.7}Sr_{0.3}Mn_{0.5})_3(Mn_{0.5}Cu_{0.5})_2O_7$ is applied to a complex magnetic head. A Ti layer 42 having a thickness of 50 nanometers is provided on a Si wafer 42 by a dc-sputtering. A Pt layer 43 having a thickness of 200 nanometers is provided on the Ti layer 42 by a dc-sputtering. A polycrystal $SrTiO_3$ layer 44 having a thickness of 200 nanometers is provided on the Pt layer 43 by an RF-sputtering. A magnetic oxide film 45 made of $(Y_{0.7}Sr_{0.3}Mn_{0.5})_3(Mn_{0.5}Cu_{0.5})_2O_7$ is formed by ion beam sputtering method under the conditions mentioned on Table 2. Electrodes 46 made of $RuO_2$ and having a thickness of 200 nanometers are formed by dc-sputtering on the magnetic oxide film 45. An alumna protection layer 47 is provided to cover the electrodes 46 by an RF-magnetron sputtering to protect the magnetic oxide film 45 from moisture in atmosphere.

TABLE 2

| $(Y_{0.7}Sr_{0.3}Mn_{0.5})_3(Mn_{0.5}Cu_{0.5})_2O_7$ | |
| --- | --- |
| Target Component | $(Y_{0.7}Sr_{0.3}Mn_{0.5})_3(Mn_{0.5}Cu_{0.5})_2O_7$ |
| Ion beam voltage | 1.0–2.0 kV |
| Ion beam current | 50–100 mA |
| Sputtering Gas | $Ar:O_2 = 10:1$ |
| Gas Pressure | 0.1–0.5 mTorr |
| Substrate Temperature | 600–700° C. |
| Thickness | 150–200 nanometers |

The magnetic oxide film 45 made of $(Y_{0.7}Sr_{0.3}Mn_{0.5})_3(Mn_{0.5}Cu_{0.5})_2O_7$ shows −20% of magnetoresistance variation at room temperature in a magnetic field of 1000 Oe. It is confirmed that if the head is subjected to an annealing at a temperature in the range of 400°–600° C. in an oxygen atmosphere, then the rate of variation of the magnetoresistance is increased and the sensitivity of the sensor or detector is accordingly improved.

As modifications, it is possible to use $Al_2O_3$, MgO, $SrTiO_3$, $LaAlO_3$ as a material for the body 41 as well as Pt, Al, Ti, Ta, Au, W, Si, Cu, Au and alloy thereof as a material for the electrodes 46. For the magnetic oxide film 45, it is possible to replace Y by La, Pr, Nd, Eu, Dy, Yb or Bi as well as replace Sr by Ca, Ba or Pb in addition replace Cu by Ni.

Figure 8:
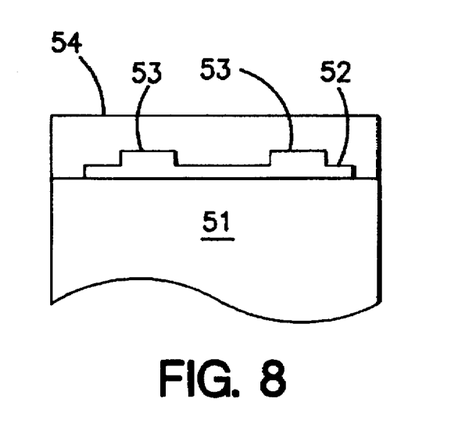
FIG. 8 is a fragmentary cross sectional view illustrative of a highly sensitive complex magnetic head detector utilizing a novel magnetic oxide in a third embodiment according to the present invention.

A third embodiment according to the present invention will be described in detail with reference to FIG. 8, wherein the novel magnetic oxide $(Bi_{0.35}Pb_{0.65}O)_2(Sr_2CaMn_2O_6)$ is applied to a complex magnetic head. A magnetic oxide film 52 made of $(Bi_{0.35}Pb_{0.65}O)_2(Sr_2CaMn_2O_6)$ is formed on a $LaAlO_3$ body 51 mirror-polished by an RF magnetron sputtering method under the conditions mentioned on Table 3. The oxide $(Bi_{0.35}Pb_{0.65}O)_2(Sr_2CaMn_2O_6)$ is strongly oriented in the direction of <100>. Electrodes 53 made of Au and having a thickness of 300 nanometers are formed by dc-sputtering on the magnetic oxide film 52. An alumna protection layer 54 is provided to cover the electrodes 53 by an RF-magnetron sputtering to protect the magnetic oxide film 52 from moisture in atmosphere.

TABLE 3

| $(Bi_{0.35}Pb_{0.65}O)_2(Sr_2CaMn_2O_6)$ | |
|---|---|
| Target Component | $(Bi_{0.35}Pb_{0.65}O)_2(Sr_2CaMn_2O_6)$ |
| RF power | 1.0–2.0 W |
| Sputtering Gas | $Ar:O_2 = 10:1$ |
| Gas Pressure | 10–20 mTorr |
| Substrate Temperature | 600–700° C. |
| Thickness | 150–200 nanometers |

The magnetic oxide film 45 made of $(Bi_{0.35}Pb_{0.65}O)_2(Sr_2CaMn_2O_6)$ shows –25% of magnetoresistance variation at room temperature in a magnetic field of 1000 Oe. The magnetoresistance effect is anisotropic so that when the magnetic field is applied in parallel to the surface of the layer, the variation in the magnetoresistance is slightly larger. It is confirmed that if the head is subjected to an annealing at a temperature in the range of 400°–600° C. in an oxygen atmosphere, then the rate of variation of the magnetoresistance is increased and the sensitivity of the sensor or detector is accordingly improved.

As modifications, it is possible to use $Al_2O_3$, MgO, $SrTiO_3$, $LaAlO_3$ as a material for the body 51 as well as Pt, Al, Ti, Ta, Au, W, Si, Cu, Au and alloy thereof and TiN, $IrO_2$ and $RuO_2$ as a material for the electrodes 53. For the magnetic oxide film 52, it is possible to replace Pb by Tl, and replace Sr and Ca by Ba as well as partially replace Mn by Ni or Cu.

Figure 9:
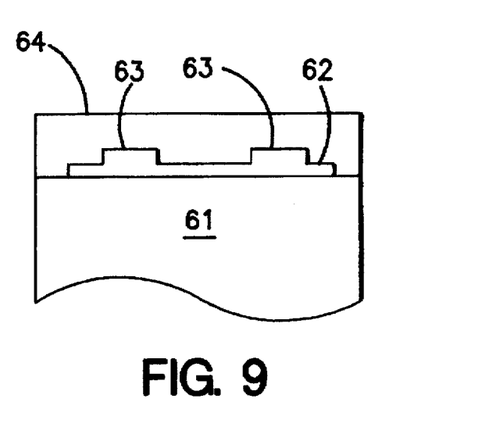
FIG. 9 is a fragmentary cross sectional view illustrative of a highly sensitive complex magnetic head detector utilizing a novel magnetic oxide in a fourth embodiment according to the present invention.

A fourth embodiment according to the present invention will be described in detail with reference to FIG. 9, wherein the novel magnetic oxide $(BiO)_2[Bi_2(Mn_{0.6}Ta_{0.4})_3O_{10}]$ is applied to a complex magnetic head. A magnetic oxide film 62 made of $(BiO)_2[Bi_2(Mn_{0.6}Ta_{0.4})_3O_{10}]$ is formed on a (100) plane of a MgO body 61 mirror-polished by a metal organic resolving method under the conditions mentioned on Table 4. The oxide $(BiO)_2[Bi_2(Mn_{0.6}Ta_{0.4})_3O_{10}]$ is strongly oriented in the direction of <100>. Electrodes 63 made of Pt and having a thickness of 200 nanometers are formed by dc-sputtering on the magnetic oxide film 62. A zirconium protection layer 64 is provided to cover the electrodes 63 by an RF-magnetron sputtering to protect the magnetic oxide film 62 from moisture in atmosphere.

TABLE 4

| $(BiO)_2[Bi_2(Mn_{0.6}Ta_{0.4})_3O_{10}]$ | |
|---|---|
| Metal Sources | Bi: Bismuth 2-ethylhexthan acid |
| | Mn: Di-isopropoxy manganese |
| | Ta: Pentaethoxy tantalum |
| Solvent | 1-ethoxy-2-propanol |
| | xylene |
| Reflux temperature | 120° C. |
| Temperature for dry | 250° C. |
| Temperature for baking | 800° C. |
| Thickness | 150–200 nanometers |

The magnetic oxide film 45 made of $(BiO)_2[Bi_2(Mn_{0.6}Ta_{0.4})_3O_{10}]$ shows –25% of magnetoresistance variation at room temperature in a magnetic field of 1000 Oe. The magnetoresistance effect is anisotropic so that when the magnetic field is applied in parallel to the surface of the layer, the variation in the magnetoresistance is slightly larger. It is confirmed that if the head is subjected to an annealing at a temperature in the range of 400°–600° C. in an oxygen atmosphere, then the rate of variation of the magnetoresistance is increased and the sensitivity of the sensor or detector is accordingly improved.

As modifications, it is possible to use $Al_2O_3$, MgO, $SrTiO_3$, $LaAlO_3$ as a material for the body 61 as well as Al, Ti, Ta, W, Si, Cu, Ag, Au and alloy thereof and TiN, $IrO_2$ and $RuO_2$ as a material for the electrodes 63. For the magnetic oxide film 62, it is possible to replace Bi by Y, La, Pr, Nd, Eu, Dy, Yb, Ca, Sr, Ba, Pb as well as replace Ta by Nb, Zr, Ti.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A magnetic oxide represented by $A_{1-x}A'_xMn_{1-y}M_yO_z$, where: A is at least one element selected from the group consisting of lanthanoid, Y and Bi; A' is at least one element selected from the group consisting of alkaline earth metals and Pb; M is at least one element selected from the group consisting of Ni and Cu; $0<x$, $y\leq 0.5$; and $2.5\leq z\leq 3.5$.

2. A magnetic oxide represented by $(A'_{1-x}A_x)_{n+1}(Mn_{1-y}M_y)_nO_z$, where: A is at least one element selected from the group consisting of lanthanoid, Y and Bi; A' is at least one element selected from the group consisting of alkaline earth metals and Pb; M is at least one element selected from the group consisting of Ni and Cu; $0<x$, $y\leq 0.5$; and $3n\leq z\leq 3n+2$, $n=1, 2, 3$.

3. A magnetic oxide represented by $(BiO)_2[(A_{1-x}A'_x)_n(Mn_{1-y}M_y)_{n+1}O_z]$, where: A is at least one element selected from the group consisting of lanthanoid, Y and Bi; A' is at least one element selected from the group consisting of alkaline earth metals and Pb; M is at least one element selected from the group consisting of Ta, Nb, Ti and Zr; $0\leq x\leq 0.5$; $0\leq y<1$; and $2n+2\leq z\leq 3n+4$, $n=3, 4, 5$.

4. A magnetic oxide represented by $(Bi_{1-x}B_xO)_2[A_{n+1}(Mn^{1-y}M_y)_nO_z]$, where: A is at least one element selected from the group consisting of lanthanoid; B is at least one element selected from the group consisting of Pb and Tl; M is at least one element selected from the group consisting of Ni and Cu; $0.5\leq x\leq 1$; $0\leq y\leq 0.5$; and $2n+2\leq z\leq 3n+2$, $n=1, 2, 3, 4$.

5. A magnetic detector comprising:

a magnetic oxide represented by $(A'_{1-x}A_x)_{n+1}(Mn_{1-y}M_y)_nO_z$, where: A is at least one element selected from the group consisting of lanthanoid, Y and Bi; A' is at least one element selected from the group consisting of alkaline earth metals and Pb; M is at least one element selected from the group consisting of Ni and Cu; $0<x$, $y\leq0.5$; and $3n\leq z\leq3n+2$, $n=1, 2, 3$; and at least a pair of electrodes provided on said magnetic oxide and being separated from each other via said magnetic oxide.

6. A magnetic detector comprising:

a magnetic oxide represented by $(BiO)_2[(A_{1-x}A'_x)_n(Mn_{1-y}M_y)_{n+1}O_z]$, where: A is at least one element selected from the group consisting of lanthanoid, Y and Bi; A' is at least one element selected from the group consisting of alkaline earth metals and Pb; M is at least one element selected from the group consisting of Ta, Nb, Ti and Zr; $0\leq x\leq0.5$; $0\leq y<1$; and $2n+2\leq z\leq3n+4$, $n=3, 4, 5$; and at least a pair of electrodes provided on said magnetic oxide and being separated from each other via said magnetic oxide.

7. A magnetic detector comprising:

a magnetic oxide represented by $(Bi_{1-x}B_xO)_2[A_{n+1}(Mn_{1-y}M_y)_nO_z]$, where: A is at least one element selected from the group consisting of lanthanoid; B is at least one element selected from the group consisting of Pb and Tl; M is at least one element selected from the group consisting of Ni and Cu; $0.5\leq x\leq1$; $0\leq y\leq0.5$; and $2n+2\leq z\leq3n+2$, $n=1, 2, 3, 4$; and at least a pair of electrodes provided on said magnetic oxide and being separated from each other via said magnetic oxide.

8. A magnetic detector comprising:

a magnetic oxide represented by $A_{1-x}A'_xMn_{1-y}M_yO_z$, where: A is at least one element selected from the group consisting of lanthanoid, Y and Bi; A' is at least one element selected from the group consisting of alkaline earth metals and Pb; M is at least one element selected from the group consisting of Ni and Cu; $0<x$, $y\leq0.5$; and $2.5\leq z\leq3.5$.

* * * * *